US011677592B2

(12) United States Patent
Belitzer (10) Patent No.: US 11,677,592 B2
(45) Date of Patent: Jun. 13, 2023

(54) TRANSMITTERS AND METHODS FOR OPERATING THE SAME

(71) Applicant: Intel Corporation, Santa Clara, CA (US)

(72) Inventor: Alexander Belitzer, Munich (DE)

(73) Assignee: Intel Corporation, Santa Clara, CA (US)

( * ) Notice: Subject to any disclaimer, the term of this patent is extended or adjusted under 35 U.S.C. 154(b) by 17 days.

(21) Appl. No.: 16/767,146

(22) PCT Filed: Mar. 21, 2018

(86) PCT No.: PCT/US2018/023446
§ 371 (c)(1),
(2) Date: May 27, 2020

(87) PCT Pub. No.: WO2019/182574
PCT Pub. Date: Sep. 26, 2019

(65) Prior Publication Data
US 2020/0389342 A1    Dec. 10, 2020

(51) Int. Cl.
*H04L 25/02*        (2006.01)
*H03F 3/21*         (2006.01)

(52) U.S. Cl.
CPC .......... *H04L 25/0282* (2013.01); *H03F 3/211* (2013.01); *H04L 25/029* (2013.01)

(58) Field of Classification Search
CPC ... H04L 25/0282; H04L 25/029; H04L 25/02; H04L 25/03; H04L 25/028; H03F 3/211
See application file for complete search history.

(56) References Cited

U.S. PATENT DOCUMENTS

| 4,300,161 | A | * | 11/1981 | Haskell | ...................... | H04J 3/18 |
| | | | | | | 348/E7.039 |
| 5,256,987 | A | * | 10/1993 | Kibayashi | ............ | H03G 3/3042 |
| | | | | | | 330/51 |
| 6,064,260 | A | * | 5/2000 | Montgomery | .......... | H03F 1/526 |
| | | | | | | 330/297 |
| 6,157,253 | A | | 12/2000 | Sigmon et al. | | |
| 9,264,005 | B1 | * | 2/2016 | Cho | ...................... | H03F 1/0222 |
| 10,090,808 | B1 | * | 10/2018 | Henzler | .................... | H03F 3/21 |
| 2002/0142790 | A1 | | 10/2002 | Samelis et al. | | |
| 2012/0056677 | A1 | * | 3/2012 | Zhu | ...................... | H03G 3/3042 |
| | | | | | | 330/296 |
| 2012/0235736 | A1 | | 9/2012 | Levesque et al. | | |

(Continued)

FOREIGN PATENT DOCUMENTS

WO    WO-2018187245 A1 * 10/2018 ............ H03F 1/0211

*Primary Examiner* — Jean B Corrielus
(74) *Attorney, Agent, or Firm* — 2SPL Patent Attorneys PartG mbB; Kieran O'Leary (57) ABSTRACT

A transmitter is provided. The transmitter includes a bus system including at least two bus lines. Further, the transmitter includes an envelope tracking circuit coupled to the at least two bus lines, and a plurality of power amplifiers. At least a first one of the plurality of power amplifiers, while in active state, is configured to selectively couple its input to the one of the at least two bus lines which is supplied with a supply voltage or a bias signal by the envelope tracking circuit that is based on an envelope of a first baseband signal related to a first radio frequency signal received by the first one of the plurality of power amplifiers for amplification.

22 Claims, 5 Drawing Sheets

(56) References Cited

U.S. PATENT DOCUMENTS

| | | |
|---|---|---|
| 2013/0214862 A1 | 8/2013 | Presti et al. |
| 2014/0009226 A1* | 1/2014 | Severson ................ H03F 3/24 |
| | | 330/124 R |
| 2016/0072530 A1 | 3/2016 | El-Hassan et al. |
| 2016/0181995 A1* | 6/2016 | Nentwig ................ H03F 3/211 |
| | | 330/295 |
| 2016/0248379 A1* | 8/2016 | Lehtola .................. H03F 3/195 |
| 2019/0036486 A1* | 1/2019 | Henzler ................... H03F 3/21 |

* cited by examiner

TRANSMITTERS AND METHODS FOR OPERATING THE SAME

FIELD

The present disclosure relates to power supply and bias distribution within transmitters. In particular, examples relate to transmitters using ET and methods for operating a transmitter.

BACKGROUND

The number of frequency bands to be combined in mobile communication is increasing in each new generation. Accordingly, the number of active Power Amplifier (PA) cores is increasing. In addition, new Radio Access Technology (RAT) is emerging and has to work together with already existing RAT. This makes the number of carrier aggregation scenarios even higher. Providing the envelope tracking signal to each of the actives cores becomes a challenge.

Conventional architecture can support an increased number of carrier aggregation scenarios only by a massive increase in hardware content, hitting the area limitation inside mobile applications.

Hence, there may be a desire for an improved signal distribution architecture.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a", "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

The following wireless communication circuits using signal distribution or transmitters according to the proposed technique or one or more of the examples described above may be configured to operate according to one of the $3^{rd}$ Generation Partnership Project (3GPP) standardized mobile communication networks or systems. The mobile or wireless communication system may correspond to, for example, a $5^{th}$ Generation New Radio (5G NR), a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

Figure 1:
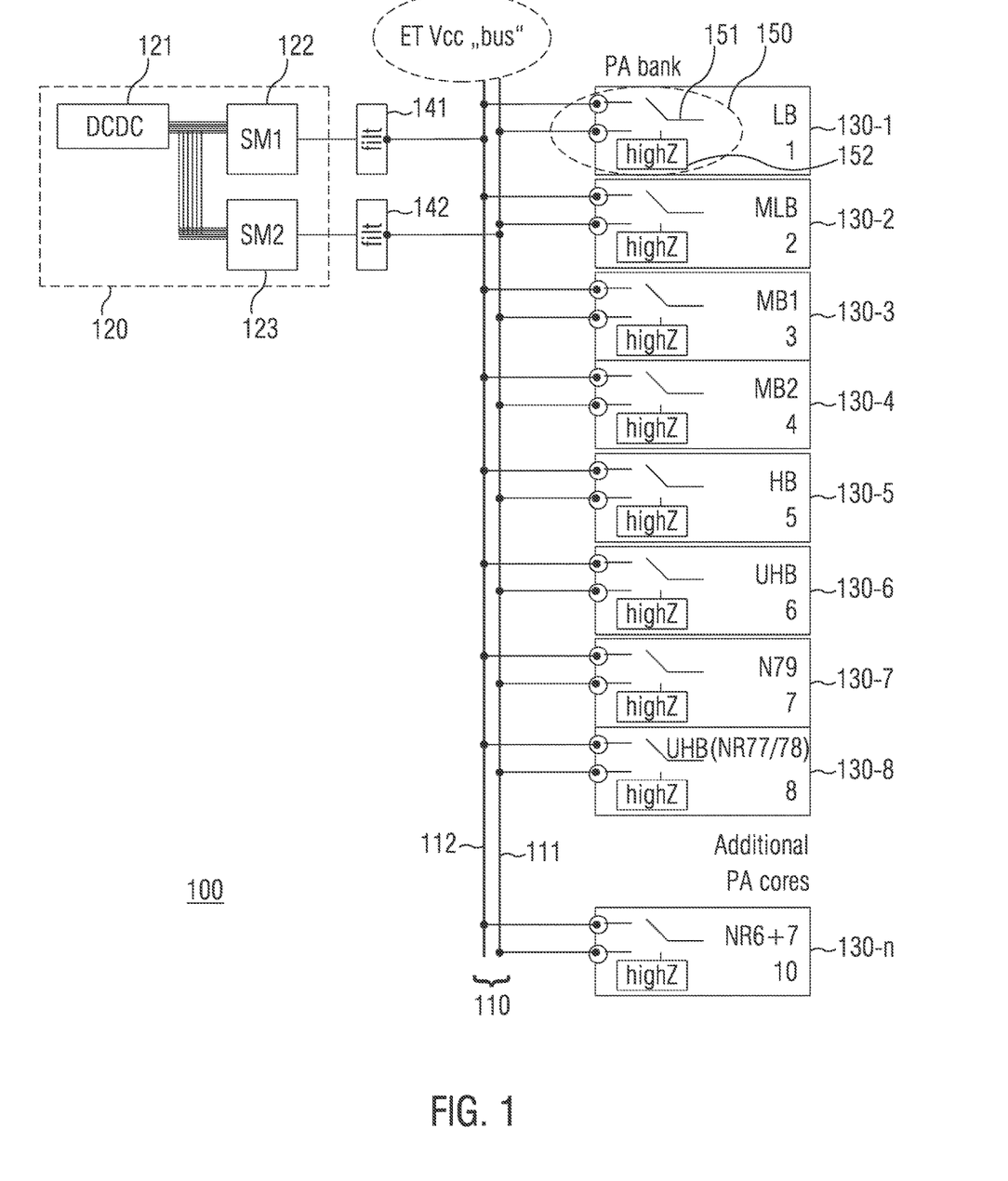
FIG. 1 illustrates a first example of a transmitter.

FIG. 1 illustrates a transmitter 100. Transmitter 100 comprises a plurality of PAs 130-1, 130-2, . . . , 130-*n*. Although ten PAs are illustrated in FIG. 1, it is to be noted that transmitter 100 may comprise any plurality of PAs (i.e. at least two PAs). In an active state, each of the plurality of PAs 130-1, 130-2, . . . , 130-*n* is configured to amplify an input Radio Frequency (RF) signal. A PA operates at optimum efficiency for given instantaneous output power requirements, if the supply voltage for the PA follows the envelope of the RF signal for amplification. Therefore, transmitter 100 comprises an Envelope Tracking (ET) circuit 120. ET circuit 120 generates (individual) supply voltages for at least some (part) of the plurality of PAs 130-1, 130-2, . . . , 130-*n*.

Further, transmitter 100 comprises a bus system 110 comprising at least a first bus line (supply line, signal line) 111 and a second bus line (supply line, signal line) 112, i.e.

at least two bus lines. ET circuit 120 is coupled to the at least two bus lines (supply lines, signal lines) 111, 112.

A first (supply) filter 141 is coupled between ET circuit 120 and first bus line 111, and a second (supply) filter 142 is coupled between ET circuit 120 and second bus line 112. That is, a respective filter is coupled between ET circuit 120 and each of the at least two bus lines 111, 112.

ET circuit 120 is configured to simultaneously supply a first supply voltage to the first bus line 111 and a second supply voltage to the second bus line 112.

If a first PA 130-1 of the plurality of PAs 130-1, 130-2, . . . , 130-*n* receives a first RF signal for amplification, the first PA 130-1 is configured to selectively couple its (power supply) input 151 to the first bus line 111, if the first supply voltage is based on an envelope of a first baseband signal related to the first RF signal. If the second supply voltage is based on the envelope of the first baseband signal, the first PA 130-1 is configured to selectively couple its input 151 to the second bus line 112.

In other words, at least the first PA 130-1 of the plurality of PAs 130-1, 130-2, . . . , 130-*n*, while in the active state, is configured to selectively couple its input 151 to the one of the at least two bus lines 111, 112 which is supplied with a supply voltage by ET circuit 120 that is based on the envelope of the first baseband signal, i.e. based on the envelope of a baseband signal that is related to the RF signal received by the first PA 130-1 for amplification.

If a second PA 130-2 of the plurality of PAs receives a second RF signal for amplification, the second PA 130-2 is configured to selectively couple its (power supply) input 161 to the first bus line 111, if the first supply voltage is based on an envelope of a second baseband signal related to the second RF signal. If the second supply voltage is based on the envelope of the second baseband signal, the second PA 130-2 is configured to selectively couple its input 161 to the second bus line 112.

Similarly, if another one of the plurality of PAs 130-1, 130-2, . . . , 130-*n* receives a respective RF signal for amplification, the other PA is configured to selectively couple its (power supply) input to the first bus line 111, if the first supply voltage is based on an envelope of a baseband signal related to the respective RF signal received by the PA. If the second supply voltage is based on the envelope of this baseband signal, the other PA is configured to selectively couple its input to the second bus line 112.

In other words, each of the plurality of PAs 130-1, 130-2, . . . , 130-*n*, while in active state, may be configured to couple its (power supply) input to the one of the at least two bus lines 111, 112 which is supplied with a supply voltage by ET circuit 120 that is based on an envelope of a baseband signal related to a RF signal received by the respective one of the plurality of PAs 130-1, 130-2, . . . , 130-*n* for amplification.

Individual PAs of the plurality of PAs 130-1, 130-2, . . . , 130-*n* may, hence, be selectively connected to the bus system 110 in a flexible way. Accordingly, multiple pairs of the plurality of PAs 130-1, 130-2, . . . , 130-*n* may be operated simultaneously in the active state and be provided with a respective supply voltage that is based on the envelopes of the respective RF signals for amplification. In the example of FIG. 1, the bus system 110 comprises at least two bus lines 111, 112 so that at least two PAs of the plurality of PAs 130-1, 130-2, . . . , 130-*n* may be simultaneously in the active state. For example, the first PA 130-1 and the second PA 130-2 may be configured to simultaneously receive the first RF signal and the second RF signal, respectively. However, also any other pair of the plurality of PAs 130-1, 130-2, . . . , 130-*n* may be simultaneously in the active state (i.e. amplify input RF signals).

Due to the selective coupling of the plurality of PAs 130-1, 130-2, . . . , 130-*n* to the bus lines of bus system 110, the number of bus lines may be selected smaller than the number of the plurality of PAs 130-1, 130-2, . . . , 130-*n*. The coupling of the active PAs to ET circuit 120 via bus system 110 is, hence, area effective. The number of bus lines may, e.g., be equal to the maximum supported number of PAs simultaneously operated in the active state. Since in the active state each PA of the plurality of PAs 130-1, 130-2, . . . , 130-*n* may be selectively coupled to a bus line of bus system 110, the number of bus lines may be as small as the maximum supported number of PAs simultaneously operated in the active state.

The first PA 130-1 is further configured to decouple its input 151 from the at least two bus lines 111, 112, if the first PA 130-1 does not receive the first RF signal for amplification, i.e. if the first PA 130-1 is in an inactive state.

Further, the first PA 130-1 may be configured to couple its high impedance terminal 152 to one of the at least two bus lines 111, 112, if the first PA 130-1 does not receive the first RF signal for amplification. The high impedance terminal is configured to present high impedance to any coupled device or element. For example, first PA 130-1 of the plurality of PAs 130-1, 130-2, . . . , 130-*n* may comprise a switch circuit 150 configured to couple the input 151 to the one of the at least two bus lines 111, 112, if first PA 130-1 of the plurality of PAs 130-1, 130-2, . . . , 130-*n* is in the active state. If first PA 130-1 of the plurality of PAs 130-1, 130-2, . . . , 130-*n* is in the inactive state, first PA 130-1 may couple its high impedance terminal 152 to one of the at least two bus lines 111, 112.

Similarly, also the other PAs of the plurality of PAs 130-1, 130-2, . . . , 130-*n* may comprise respective switch circuits configured to couple or decouple an input of the respective PA to one of the at least two bus lines 111, 112, or to couple a high impedance terminal of the respective PA to one of the at least two bus lines 111, 112 in the inactive state.

In other words, each PA core may comprise a selector switch which can select the correct supply voltage from the bus 110, and in case the PA core is off provide high resistance (i.e. "high Z") to the bus 110.

For example, switch circuit 150 may be configured to receive information about the one of the at least two bus lines 111, 112 which is supplied with a supply voltage by ET circuit 120 that is based on the envelope of the first baseband signal. In one example, the supply voltage provided by the ET circuit 120 may be based on the envelope of a baseband signal that is related to the RF signal received by first PA 130-1 for amplification. The information about the one of the bus lines 111, 112 which is supplied with the supply voltage for the respective PA of the plurality of PAs 130-1, 130-2, . . . , 130-*n* may, e.g., be provided by a control circuit (not illustrated) of transmitter 100. The control circuit may further control ET circuit 120 to supply a supply voltage, suitable for one of the plurality of PAs 130-1, 130-2, . . . , 130-*n*, to a specific one of the at least two bus lines 111, 112.

As indicated in FIG. 1, ET circuit 120 may comprise, for example, a DC-to-DC converter circuit 121 configured to generate a plurality of predefined supply voltages. Further, ET circuit 120 comprises a first selection circuit (supply modulator) 122 and a second selection circuit 123 configured to (simultaneously) select respective ones of the plurality of supply voltages based on the envelopes of respective baseband signals related to respective RF signals received simultaneously by a pair of the plurality of PAs 130-1, 130-2, . . . , 130-$n$.

The first selection circuit 122 is configured to select, based on one of the envelope of a first baseband signal and the envelope of a second baseband signal, one of the plurality of supply voltages as the first supply voltage, and supply it to the first bus line 111. Similarly, the second selection circuit 123 is configured to select, based on the other one of the envelope of the first baseband signal and the envelope of the second baseband signal, one of the plurality of supply voltages as the second supply voltage, and supply it to the second bus line 112. Accordingly, supply voltages for two PAs of the plurality of PAs 130-1, 130-2, . . . , 130-$n$ may be provided.

For example, the first selection circuit 122 may be configured to select one of the plurality of supply voltages as the first supply voltage based on the envelope of the first baseband signal. Accordingly, the second selection circuit 123 may be configured to select one of the plurality of supply voltages as the second supply voltage based on the envelope of the second baseband signal. If the first PA 130-1 receives a first RF signal related to the first baseband signal, the first PA 130-1 selectively couples its (power supply) input 151 to the first bus line 111. If the second PA 130-2 receives a second RF signal related to the second baseband signal, the second PA 130-1 selectively couples its (power supply) input 161 to the second bus line 112.

Alternatively, if the first PA 130-1 receives the second RF signal, the first PA 130-1 selectively couples its (power supply) input 151 to the second bus 112. If the second PA 130-2 receives the first RF signal, the second PA 130-1 selectively couples its (power supply) input 161 to the first bus line 111.

In some examples, the first selection circuit 122 may alternatively be coupled to the second bus line 112, whereas the second selection circuit 123 may be coupled to the first bus line 111. In other examples, the first and the second selection circuits 122 and 123 may alternate between first and second bus lines 111 and 112 either periodically or based on occurrence of an event.

In other words, a first selection circuit of ET circuit 120 may be configured to select a first one of the plurality of supply voltages based on an envelope of a first baseband signal related to a first RF signal received by a first one of the plurality of PAs 130-1, 130-2, . . . , 130-$n$ for amplification, and to supply the selected first one of the first plurality of supply voltages to the one of the at least two bus lines 111, 112. Further, a second selection circuit of ET circuit 120 may be configured to select a second one of the plurality of supply voltages based on an envelope of a second baseband signal related to a second RF signal received by a second one of the plurality of PAs 130-1, 130-2, . . . , 130-$n$ for amplification, and to supply the selected second one of the plurality of supply voltages to another one of the at least two bus lines 111, 112.

FIG. 1 illustrates how an ET supply voltage may be provided to any pair of the PA cores 130-1, 130-2, . . . , 130-$n$ using bus system 110 with two supply voltages coming from the two supply modulators 122 and 123. Any pair of the PA cores 130-1, 130-2, . . . , 130-$n$ may be active at the same time getting its respective supply voltage from the selected rail (out of bus system 110). Since only two supply modulators 122 and 123 with only two supply filters 141 and 142 are required, the proposed architecture may enable small size and high flexibility.

For example PA 130-1 may amplify RF signals in a low frequency band (Low Band, LB), whereas PA 130-5 may amplify RF signals in a high frequency band (High Band, HB). Both PAs may be operated simultaneously in a carrier aggregation scenario. Accordingly, PA 130-1 may use a first ET based supply voltage from first supply modulator 122, and PA 130-5 may use a second ET based supply voltage from second supply modulator 123. All other PA cores, which are off (i.e. in the inactive state), may provide high impedance to bus system 110.

Also two different RATs may be combined. For example, PA 130-1 may amplify a LTE RF signal using a first ET based supply voltage from first supply modulator 122, and PA 130-7 may amplify a 5G NR RF signal using a second ET based supply voltage from second supply modulator 123.

In the foregoing description, it was assumed that the maximum supported number of PAs simultaneously operated in the active state is two. Accordingly, bus system 110 comprises two bus lines 111, 112, and ET circuit 120 comprises two selection circuits 122, 123. However, as indicated above, the maximum supported number of PAs simultaneously operated in the active state may be any number. Accordingly, the bus system may, e.g., comprise three or more bus lines.

Figure 2:
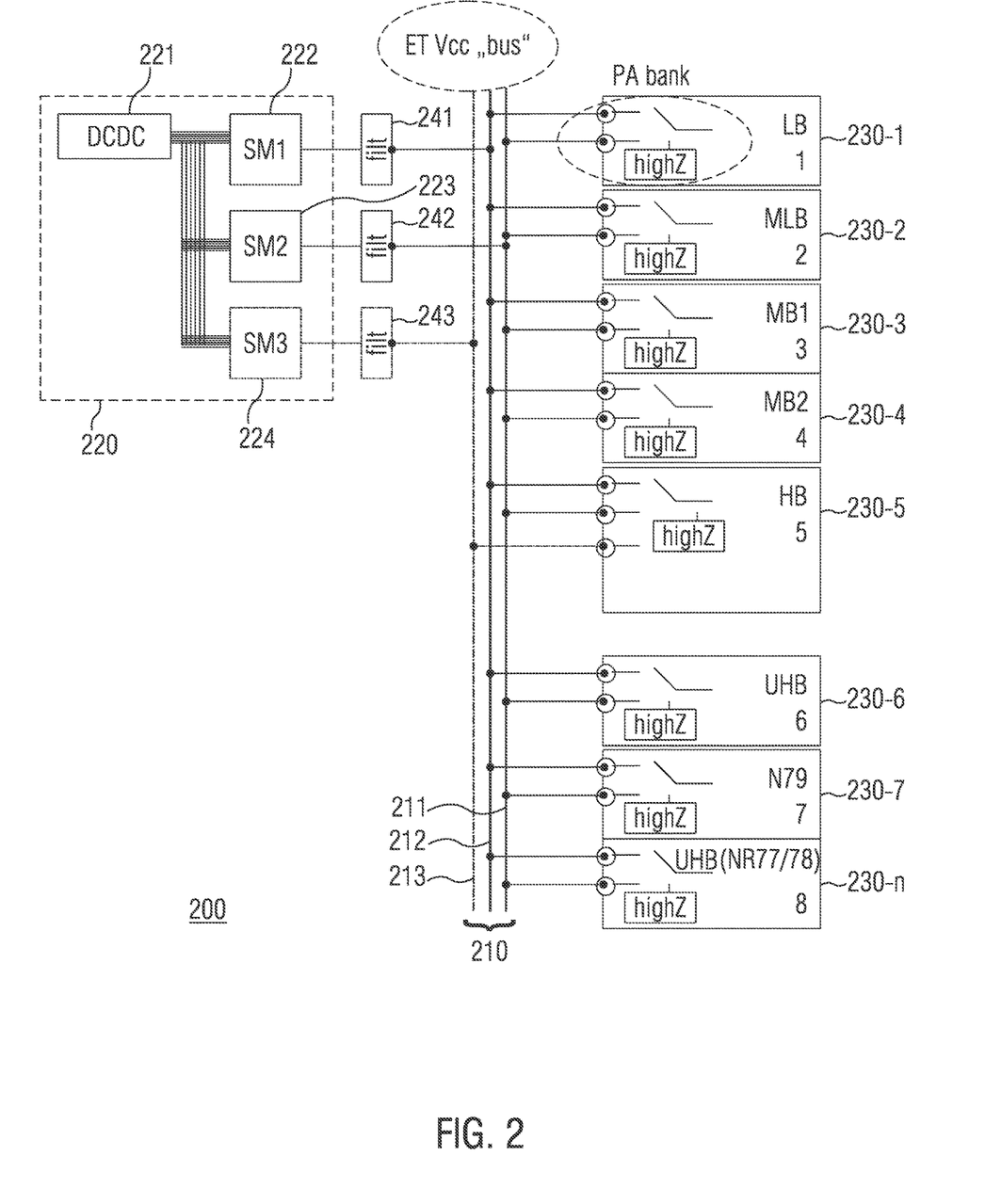
FIG. 2 illustrates a second example of a transmitter.

FIG. 2 illustrates a transmitter 200 supporting a simultaneous operation of at maximum three PAs. Transmitter 200 is identical to transmitter 100 except that bus system 210 comprises three bus line 211, 212, and 213 instead of two bus lines like bus system 110. Further, ET circuit 220 comprises in addition the first and second selection circuits 222 and 223 a third selection circuit 224.

The illustrated plurality of PAs 230-1, 230-2, . . . , 230-$n$ comprises eight PAs. However, as for transmitter 100, transmitter 200 may comprise any other plurality of PAs as well.

ET circuit 220 is configured to simultaneously supply a first supply voltage to the first bus line 211, a second supply voltage to the second bus line 212, and a third supply voltage to the third bus line 213.

DC-to-DC converter circuit 221 of ET circuit 220 is configured to generate a plurality of predefined supply voltages. The first selection circuit 222 of ET circuit 220 is configured to select, based on one of an envelope of a first baseband signal, an envelope of a second baseband signal and envelope of a third baseband signal, one of the plurality of supply voltages as the first supply voltage. The second selection circuit 222 of ET circuit 220 is configured to select, based on another other one of the envelope of the first baseband signal, the envelope of the second baseband signal and the envelope of the third baseband signal, one of the plurality of supply voltages as the second supply voltage. The third selection circuit 223 of ET circuit 220 is configured to select, based on the remaining one of the envelope of the first baseband signal, the envelope of the second baseband signal and the envelope of the third baseband signal, one of the plurality of supply voltages as the third supply voltage.

If first PA 230-1 of the plurality of PAs 230-1, 230-2, . . . , 230-$n$ receives a first RF signal for amplification that is related to the first baseband signal, the first PA 230-1 is configured to either selectively couple its input to the first bus line 211, if the first supply voltage is based on the envelope of the first baseband signal, or to selectively couple its input to the second bus line 212, if the second supply voltage is based on the envelope of the first baseband signal.

If second PA 230-2 of the plurality of PAs 230-1, 230-2, . . . , 230-$n$ receives a second RF signal for amplification that is related to second baseband signal, the second PA 230-2 is configured to either selectively couple its input to the first bus line 211, if the first supply voltage is based on the envelope of the second baseband signal, or to selectively couple its input to the second bus line 212, if the second supply voltage is based on the envelope of the second baseband signal.

If third PA 230-5 of the plurality of PAs 230-1, 230-2, ..., 230-n receives a third RF signal for amplification related to third baseband signal, the third PA 230-5 is configured to either selectively couple its input to the first bus line 211, if the first supply voltage is based on the envelope of the third baseband signal, or to selectively couple its input to the second bus line 212, if the second supply voltage is based on the envelope of the third baseband signal, or to selectively couple its input to the third bus line, if the third supply voltage is based on the envelope of the third baseband signal.

As illustrated in FIG. 2, the proposed architecture may be extended to support carrier aggregation between more than 2 bands simultaneously. The third PA 230-5 may be combined with any other pair of the plurality of PAs 230-1, 230-2, ..., 230-n (e.g. with PAs 230-1 and 230-2).

Although, only PA 230-5 is illustrated in FIG. 2 to support selective coupling to all three bus lines 211, 212, and 213, also the other PAs of the plurality of PAs 230-1, 230-2, ..., 230-n may at least in part comprise respective switch circuits enabling selective coupling to all three bus lines 211, 212, and 213.

Figure 3:
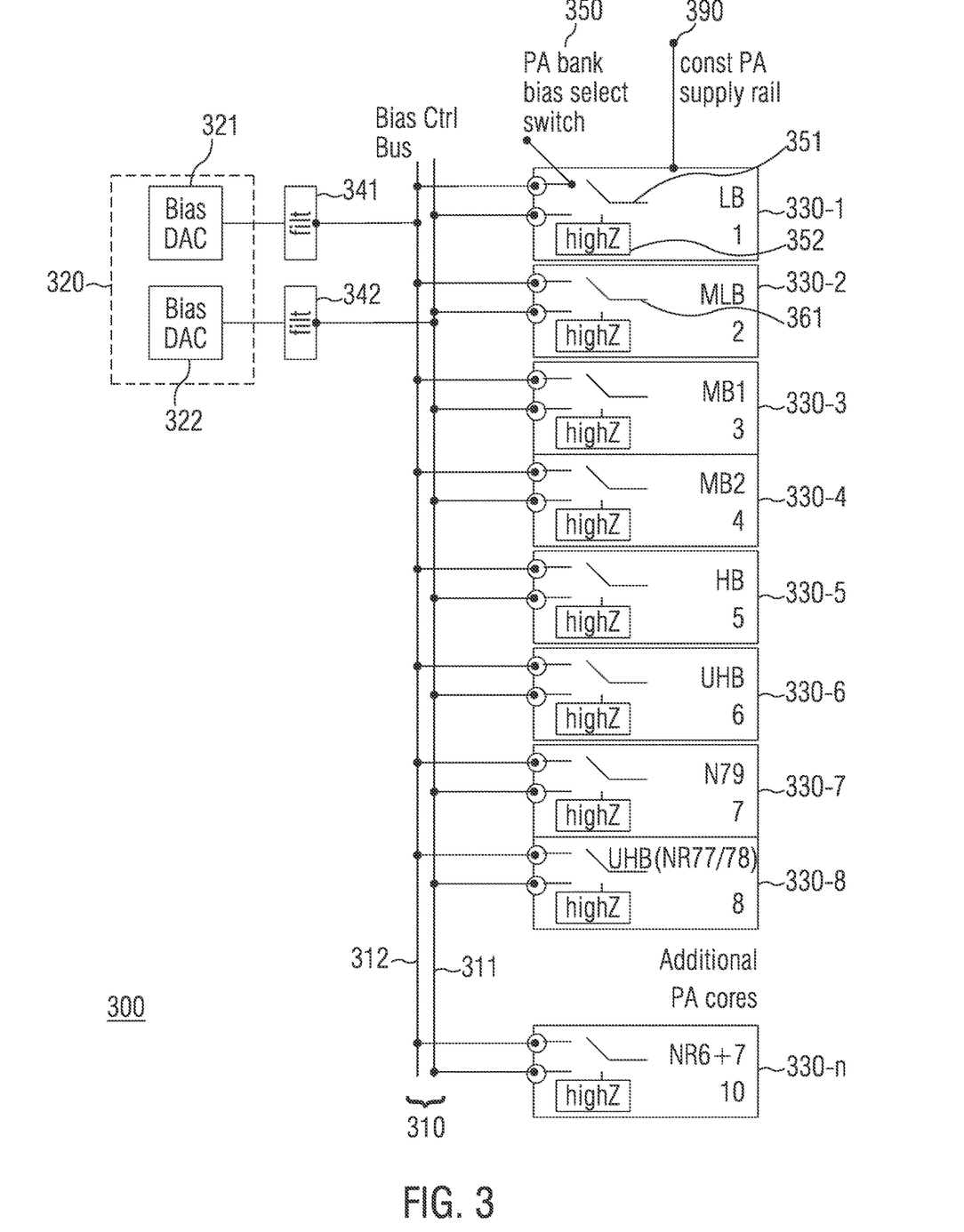
FIG. 3 illustrates a third example of a transmitter.

In foregoing, transmitters comprising PAs using a modulated supply voltage based on ET are described. However, the proposed bus architecture may further be used for transmitters comprising PAs using a modulated bias based on ET (i.e. ET modulating a PA bias proportional to RF envelope). This is exemplarily illustrated in FIG. 3. FIG. 3 illustrates a transmitter 300 comprising a plurality of PAs 330-1, 330-2, ..., 330-n. Although nine PAs are illustrated in FIG. 3, it is to be noted that transmitter 300 may comprise any plurality of PAs. As said above, the plurality of PAs 330-1, 330-2, ..., 330-n are bias controlled. In contrast to the PAs of transmitters 100 and 200, the plurality of PAs 330-1, 330-2, ..., 330-n of transmitter 300 are coupled to a constant supply voltage (not depending on the envelope of the respective input RF signal for amplification) by means of voltage supply line 390.

Again, transmitter 300 comprises a bus system 310 comprising at least a first bus line 311 and a second bus line 312, i.e. at least two bus lines. ET circuit 320 is coupled to the at least two bus lines 311, 312. A first (supply) filter 341 is coupled between ET circuit 320 and first bus line 311, and a second (supply) filter 342 is coupled between ET circuit 320 and second bus line 312. That is, a respective filter is coupled between ET circuit 320 and each of the at least two bus lines 311, 312. Although two supply lines are illustrated in FIG. 3, any other plurality of bus lines may be used similar to what is described above in connection with transmitters 100 and 200.

ET circuit 320 is configured to simultaneously supply a first bias signal to the first bus line 311 and a second bias signal to the second bus line 312. The bias signals may, e.g., carry a bias current or a bias voltage for respective ones of the plurality of PAs 330-1, 330-2, ..., 330-n.

If first PA 330-1 of the plurality of PAs 330-1, 330-2, ..., 330-n receives a first RF signal for amplification, the first PA 330-1 is configured to selectively couple its (bias) input 351 to the first bus line 311, if the first bias signal is based on an envelope of a first baseband signal related to the first RF signal. If the second bias signal is based on the envelope of the first baseband signal, the first PA 130-1 is configured to selectively couple its input 351 to the second bus line 312.

In other words, at least the first PA 330-1 of the plurality of PAs 330-1, 330-2, ..., 330-n, while in the active state, is configured to selectively couple its (bias) input 351 to the one of the at least two bus lines 311, 312 which is supplied with a bias signal by ET circuit 320 that is based on the envelope of the first baseband signal, i.e. based on the envelope of a baseband signal that is related to the RF signal received by first PA 330-1 for amplification.

If second PA 330-2 of the plurality of PAs receives a second RF signal for amplification, the second PA 330-2 is configured to selectively couple its (bias) input 361 to the first bus line 311, if the first bias signal is based on an envelope of a second baseband signal related to the second RF signal. If the second bias signal is based on the envelope of the second baseband signal, the second PA 330-2 is configured to selectively couple its input 361 to the second bus line 312.

Similarly, if another one of the plurality of PAs 330-1, 330-2, ..., 330-n receives a respective RF signal for amplification, the other PA is configured to selectively couple its (bias) input to the first bus line 311, if the first bias signal is based on an envelope of a baseband signal related to the respective RF signal received by the PA. If the second bias signal is based on the envelope of this baseband signal, the other PA is configured to selectively couple its input to the second bus line 312.

In other words, each of the plurality of PAs 330-1, 330-2, ..., 330-n, while input in active state, may be configured to couple its (bias) to the one of the at least two bus lines 311, 312 which is supplied with a bias signal by ET circuit 320 that is based on an envelope of a baseband signal related to a RF signal received by the respective one of the plurality of PAs 330-1, 330-2, ..., 330-n for amplification.

Individual PAs of the plurality of PAs 330-1, 330-2, ..., 330-n may, hence, be selectively connected to the bus system 310 in a flexible way. Accordingly, multiple pairs of the plurality of PAs 330-1, 330-2, ..., 330-n may be operated simultaneously in the active state and be provided with a respective bias signal that is based on the envelope of the respective RF signal for amplification.

As indicated in FIG. 3, ET circuit 320 may, e.g., comprise a first Digital-to-Analog Converter (DAC) 321 and a second DAC 322 configured to (simultaneously) generate respective bias signals based on the envelopes of respective baseband signals related to respective RF signals received simultaneously by pairs of the plurality of PAs 330-1, 330-2, ..., 330-n.

The first DAC 321 is configured to generate the first bias signal based on one of the envelope of the first baseband signal and the envelope of the second baseband signal, and supply it to the first bus line 311. Similarly, ET circuit 320 may comprise a second DAC 322 configured to generate the second bias signal based on the other one of the envelope of the first baseband signal and the envelope of the second baseband signal, and supply it to the second bus line 312. Accordingly, bias signals for two PAs of the plurality of PAs 330-1, 330-2, ..., 330-n may be provided.

For example, the first DAC 321 may be configured to generate the first bias signal based on the envelope of the first baseband signal. Accordingly, the second DAC 322 is configured to generate the second bias signal based on the envelope of the second baseband signal. If first PA 330-1 receives a first RF signal related to the first baseband signal, first PA 330-1 selectively couples its (bias) input to first bus line 311. If second PA 330-2 receives a second RF signal related to the second baseband signal, second PA 330-1 selectively couples its (bias) input to second bus line 312.

Alternatively, if first PA 330-1 receives the second RF signal, first PA 330-1 selectively couples its (bias) input to second bus 312. If second PA 330-2 receives the first RF signal, second PA 330-1 selectively couples its (bias) input to first bus line 311.

In some example, the first DAC 321 may alternatively be coupled to the second bus line 112, whereas the second DAC 322 may be coupled to the first bus line 111.

In other words, a first DAC of ET circuit 320 may be configured to generate a first bias signal based on an envelope of a first baseband signal related to a first RF signal received by a first one of the plurality of PAs 330-1, 330-2, ..., 330-n for amplification, and to supply the select first bias signal to the one of the at least two bus lines 311, 312. Further, a second DAC of ET circuit 320 may be configured to generate a second bias signal based on an envelope of a second baseband signal related to a second RF signal received by a second one of the plurality of PAs 330-1, 330-2, ..., 330-n for amplification, and to supply the second bias signal to another one of the at least two bus lines 311, 312.

The further aspects on coupling/decoupling individual PAs to/from bus lines, the number of bus lines, etc. described above in connection with transmitters 100 and 200 apply accordingly to transmitter 300 (taking into account that bias signals are supplied by the ET circuit instead of supply voltages). It is, hence, referred to the above description of transmitters 100 and 200 in order to avoid lengthy repetitions.

Figure 4:
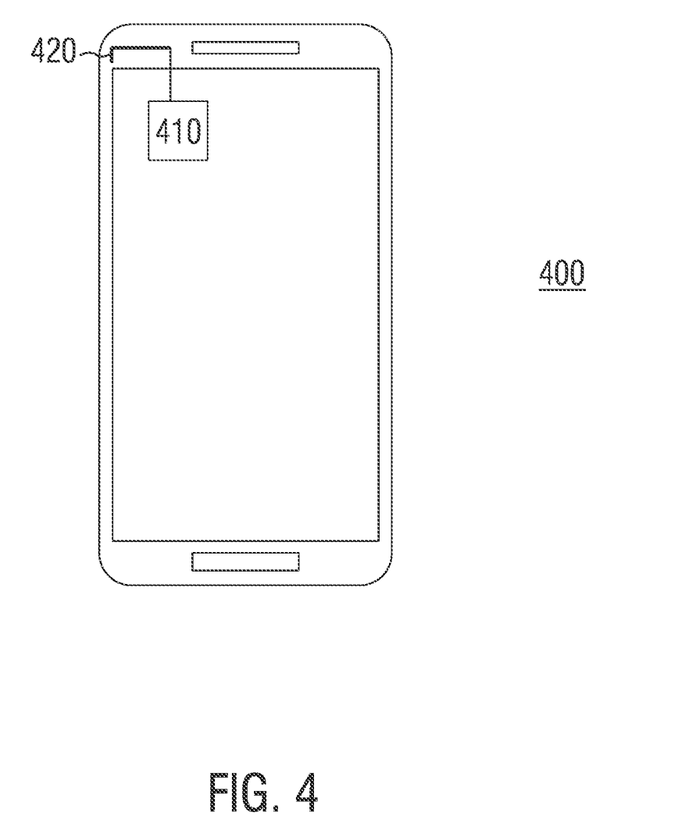
FIG. 4 illustrates an example of a mobile device comprising a transmitter.

An example of an implementation using signal distribution according to one or more aspects of the proposed technique or one or more examples described above is illustrated in FIG. 4. FIG. 4 schematically illustrates an example of a mobile device 400 (e.g. mobile phone, smart-phone, tablet-computer, or laptop) comprising at least one transmitter 410 for RF signal generation according to an example described herein. For example, transmitter 410 may be part of a RF transceiver (not illustrated). Transmitter 410 is coupled to at least one antenna element 420 for radiating the RF signal to the environment.

The mobile device 400 may comprise further elements such as, e.g., an application processor, a baseband processor, memory, an audio driver, a camera driver, a touch screen, a display driver, sensors, removable memory, a power management integrated circuit or a smart battery.

To this end, a mobile device enabling more and more carrier aggregation bands working in power efficient ET mode may be provided.

Figure 5:
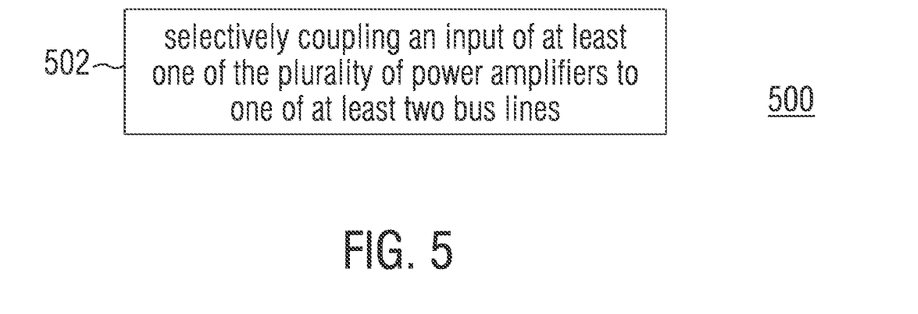
FIG. 5 illustrates a flowchart of an example of a method for operating a transmitter.

An example of a method 500 for operating a transmitter is illustrated by means of a flowchart in FIG. 5. The transmitter comprises a bus system comprising at least two bus lines, an ET circuit coupled to the at least two bus lines, and a plurality of PAs. Method 500 comprises for at least a first one of the plurality of PAs, selectively coupling 502 its input in an active state to the one of the at least two bus lines which is supplied with a supply voltage or a bias signal by the ET circuit that is based on an envelope of a first baseband signal related to a first RF signal received by the first one of the plurality of PAs for amplification.

More details and aspects of the method are mentioned in connection with the proposed technique or one or more examples described above (e.g. FIGS. 1 to 4). The method may comprise one or more additional optional features corresponding to one or more aspects of the proposed technique or one or more examples described above.

Figure 6:
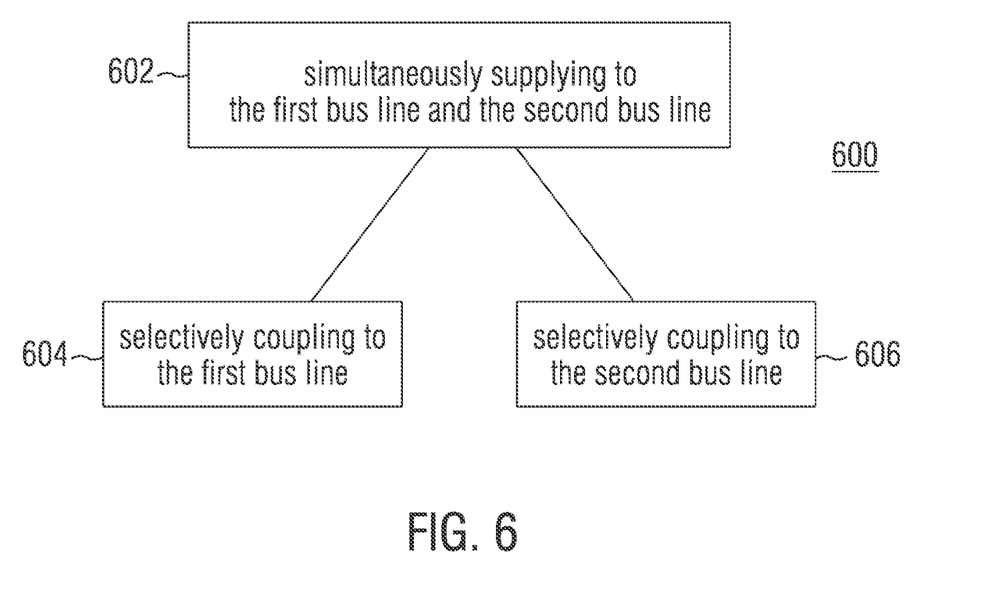
FIG. 6 illustrates a flowchart of an example of another method for operating a transmitter.

An example of another method 600 for operating a transmitter is illustrated by means of a flowchart in FIG. 6. The transmitter comprises an ET circuit, a plurality of PAs, and a bus system comprising at least a first bus line and a second bus line. Method 600 comprises simultaneously supplying 602 one of a first supply voltage and a first bias signal to the first bus line and one of a second supply voltage and a second bias signal to the second bus line using the envelope tracking circuit. If a first PA of the plurality of PAs receives a first RF signal for amplification, method 600 further comprises selectively coupling 604 the first PA's input to the first bus line, if the one of the first supply voltage and the first bias signal is based on an envelope of a first baseband signal related to the first RF signal. If the one of the second supply voltage and the second bias signal is based on the envelope of the first baseband signal, method 600 comprises selectively coupling 606 the first PA's input to the second bus line.

More details and aspects of the method are mentioned in connection with the proposed technique or one or more examples described above (e.g. FIGS. 1 to 4). The method may comprise one or more additional optional features corresponding to one or more aspects of the proposed technique or one or more examples described above.

It is evident from the above description that the proposed architecture may support ET technique for unlimited pairs of frequency bands with optimized solution size and flexibility. It may support 3, 4 or N bands to be operated simultaneously. Further, it may support dual connectivity (i.e. operation of two different RATs at different bands) with ET.

The examples as described herein may be summarized as follows:

Example 1 is a transmitter, comprising: a bus system comprising at least two bus lines; an envelope tracking circuit coupled to the at least two bus lines; and a plurality of power amplifiers, wherein at least a first one of the plurality of power amplifiers, while in active state, is configured to selectively couple its input to the one of the at least two bus lines which is supplied with a supply voltage or a bias signal by the envelope tracking circuit that is based on an envelope of a first baseband signal related to a first radio frequency signal received by the first one of the plurality of power amplifiers.

Example 2 is the transmitter of example 1, wherein the first one of the plurality of power amplifiers is configured to decouple its input from the at least two bus lines if the first one of the plurality of power amplifiers is in an inactive state.

Example 3 is the transmitter of example 2, wherein the first one of the plurality of power amplifiers comprises a switch circuit configured to couple the input to the one of the at least two bus lines, if the first one of the plurality of power amplifiers is in the active state, and to a couple a high impedance terminal of the first one of the plurality of power amplifiers to one of the at least two bus lines, if the first one of the plurality of power amplifiers is in the inactive state.

Example 4 is the transmitter of example 3, wherein the switch circuit is configured to receive information about the one of the at least two bus lines.

Example 5 is the transmitter of any of examples 1 to 4, wherein a filter is coupled between the envelope tracking circuit and each of the at least two bus lines.

Example 6 is the transmitter of any of examples 1 to 5, wherein the envelope tracking circuit comprises: a DC-to-DC converter circuit configured to generate a plurality of predefined supply voltages; a first selection circuit configured to select a first one of the plurality of supply voltages based on the envelope of the first baseband signal, and to supply the selected first one of the first plurality of supply voltages to the one of the at least two bus lines; and a second selection circuit configured to select a second one of the plurality of supply voltages based on an envelope of a second baseband signal related to a second radio frequency signal received by a second one of the plurality of power amplifiers for amplification, and to supply the selected second one of the plurality of supply voltages to another one of the at least two bus lines.

Example 7 is the transmitter of any of examples 1 to 5, wherein the envelope tracking circuit comprises: a first digital-to-analog converter configured to generate a first bias signal based on the envelope of the first baseband signal, and to supply the select first bias signal to the one of the at least two bus lines; and a second digital-to-analog converter configured to generate a second bias signal based on an envelope of a second baseband signal related to a second radio frequency signal received by a second one of the plurality of power amplifiers for amplification, and to supply the second bias signal to another one of the at least two bus lines.

Example 8 is the transmitter of any of examples 1 to 7, wherein at least two power amplifiers of the plurality of power amplifiers are simultaneously in the active state.

Example 9 is the transmitter of any of examples 1 to 8, wherein the bus system comprises three or more bus lines.

Example 10 is the transmitter of any of examples 1 to 9, wherein the number of bus lines is smaller than the number of the plurality of power amplifiers.

Example 11 is the transmitter of any of examples 1 to 10, wherein the number of bus lines is equal to the maximum supported number of power amplifiers simultaneously operated in the active state.

Example 12 is a transmitter, comprising: a bus system comprising at least a first bus line and a second bus line; an envelope tracking circuit configured to simultaneously supply one of a first supply voltage and a first bias signal to the first bus line and one of a second supply voltage and a second bias signal to the second bus line; and a plurality of power amplifiers, wherein, if a first power amplifier of the plurality of power amplifiers receives a first radio frequency signal for amplification, the first power amplifier is configured to: selectively couple its input to the first bus line, if the one of the first supply voltage and the first bias signal is based on an envelope of a first baseband signal related to the first radio frequency signal; and selectively couple its input to the second bus line, if the one of the second supply voltage and the second bias signal is based on the envelope of the first baseband signal.

Example 13 is the transmitter of example 12, wherein, if a second power amplifier of the plurality of power amplifiers receives a second radio frequency signal for amplification, the second power amplifier is configured to: selectively couple its input to the first bus line, if the one of the first supply voltage and the first bias signal is based on an envelope of a second baseband signal related to the second radio frequency signal; and selectively couple its input to the second bus line, if the one of the second supply voltage and the second bias signal is based on the envelope of the second baseband signal.

Example 14 is the transmitter of example 13, wherein the envelope tracking circuit comprises: a DC-to-DC converter circuit configured to generate a plurality of predefined supply voltages; a first selection circuit configured to select, based on one of the envelope of the first baseband signal and the envelope of the second baseband signal, one of the plurality of supply voltages as the first supply voltage; and a second selection circuit configured to select, based on the other one of the envelope of the first baseband signal and the envelope of the second baseband signal, one of the plurality of supply voltages as the second supply voltage.

Example 15 is the transmitter of example 13, wherein the envelope tracking circuit comprises: a first digital-to-analog converter configured to generate the first bias signal based on one of the envelope of the first baseband signal and the envelope of the second baseband signal; and a second digital-to-analog converter configured to generate the second bias signal based on the other one of the envelope of the first baseband signal and the envelope of the second baseband signal.

Example 16 is the transmitter of any of examples 13 to 15, wherein the first power amplifier and the second power amplifier are configured to simultaneously receive the first radio frequency signal and the second radio frequency signal, respectively.

Example 17 is the transmitter of any of examples 12 to 16, wherein the first power amplifier is configured to decouple its input from the bus lines, if the first power amplifier does not receive the first radio frequency signal.

Example 18 is the transmitter of any of examples 12 to 17, wherein the first power amplifier is configured to couple its high impedance terminal to one of the bus lines, if the first power amplifier does not receive the first radio frequency signal.

Example 19 is the transmitter of any of examples 12 to 18, wherein a first filter is coupled between the envelope tracking circuit and the first bus line, and wherein a second filter is coupled between the envelope tracking circuit and the second bus line.

Example 20 is the transmitter of any of examples 12 to 19, wherein the bus system comprises a third bus line, wherein the envelope tracking circuit is configured to simultaneously supply one of a third supply voltage and a third bias signal to the third bus line, and wherein, if a third power amplifier of the plurality of power amplifiers receives a third radio frequency signal for amplification, the third power amplifier is configured to: selectively couple its input to the first bus line, if the one of the first supply voltage and the first bias signal is based on an envelope of a third baseband signal related to the third radio frequency signal; selectively couple its input to the second bus line, if the one of the second supply voltage and the second bias signal is based on the envelope of the third baseband signal; and selectively couple its input to the third bus line, if the one of the third supply voltage and the third bias signal is based on the envelope of the third baseband signal.

Example 21 is a mobile device comprising a transmitter according to any of examples 1 to 20.

Example 22 is the mobile device of example 21, further comprising at least one antenna element coupled to the transmitter.

Example 23 is a method for operating a transmitter, wherein the transmitter comprises a bus system comprising at least two bus lines, an envelope tracking circuit coupled to the at least two bus lines, and a plurality of power amplifiers, the method comprising: for at least a first one of the plurality of power amplifiers, selectively coupling its input in an active state to the one of the at least two bus lines which is supplied with a supply voltage or a bias signal by the envelope tracking circuit that is based on an envelope of a first baseband signal related to a first radio frequency signal received by the first one of the plurality of power amplifiers for amplification.

Example 24 is the method of example 23, further comprising: if the first one of the plurality of power amplifiers is in an inactive state, decoupling its input from the at least two bus lines.

Example 25 is the method example 23 or example 24, further comprising: if the first one of the plurality of power amplifiers is in an inactive state, coupling a high impedance terminal of the first one of the plurality of power amplifiers to one of the at least two bus lines.

Example 26 is the method of any of examples 23 to 25, further comprising: generating, by the envelope tracking circuit, a plurality of predefined supply voltages; selecting, by the envelope tracking circuit, a first one of the plurality of supply voltages based on the envelope of the first baseband signal; supplying, by the envelope tracking circuit, the selected first one of the first plurality of supply voltages to the one of the at least two bus lines; selecting, by the envelope tracking circuit, a second one of the plurality of supply voltages based on an envelope of a second baseband signal related to a second radio frequency signal received by a second one of the plurality of power amplifiers for amplification; and supplying, by the envelope tracking circuit, the selected second one of the plurality of supply voltages to another one of the at least two bus lines.

Example 27 is the method of any of examples 23 to 25, further comprising: generating a first bias signal based on the envelope of the first baseband signal; supplying the select first bias signal to the one of the at least two bus lines; generating a second bias signal based on an envelope of a second baseband signal related to a second radio frequency signal received by a second one of the plurality of power amplifiers for amplification; and supplying the second bias signal to another one of the at least two bus lines.

Example 28 is the method of any of examples 23 to 27, wherein a respective filter is coupled between the envelope tracking circuit and each of the at least two bus lines.

Example 29 is the method of any of examples 23 to 28, wherein at least two power amplifiers of the plurality of power amplifiers are simultaneously in the active state.

Example 30 is the method of any of examples 23 to 29, wherein the bus system comprises three or more bus lines.

Example 31 is the method of any of examples 23 to 30, wherein the number of bus lines is smaller than the number of the plurality of power amplifiers.

Example 32 is the method of any of examples 23 to 31, wherein the number of bus lines is equal to the maximum supported number of power amplifiers simultaneously operated in the active state.

Example 33 is a method for operating a transmitter, wherein the transmitter comprises an envelope tracking circuit, a plurality of power amplifiers, and a bus system comprising at least a first bus line and a second bus line, the method comprising: simultaneously supplying one of a first supply voltage and a first bias signal to the first bus line and one of a second supply voltage and a second bias signal to the second bus line using the envelope tracking circuit; and if a first power amplifier of the plurality of power amplifiers receives a first radio frequency signal for amplification: selectively coupling the first power amplifier's input to the first bus line, if the one of the first supply voltage and the first bias signal is based on an envelope of a first baseband signal related to the first radio frequency signal; and selectively coupling the first power amplifier's input to the second bus line, if the one of the second supply voltage and the second bias signal is based on the envelope of the first baseband signal.

Example 34 is the method of example 33, wherein, if a second power amplifier of the plurality of power amplifiers receives a second radio frequency signal for amplification, the method further comprises: selectively coupling the second power amplifier's input to the first bus line, if the one of the first supply voltage and the first bias signal is based on an envelope of a second baseband signal related to the second radio frequency signal; and selectively coupling the second power amplifier's input to the second bus line, if the one of the second supply voltage and the second bias signal is based on the envelope of the second baseband signal.

Example 35 is the method of example 33 or example 34, wherein the first power amplifier and the second power amplifier simultaneously receive the first radio frequency signal and the second radio frequency signal, respectively.

Example 36 is the method of any of examples 33 to 35, wherein if the first power amplifier does not receive the first radio frequency signal, the method further comprises: decoupling the first power amplifier's input from the at least two bus lines.

Example 37 is the method of any of examples 33 to 36, wherein if the first power amplifier does not receive the first radio frequency signal, the method further comprises: coupling a high impedance terminal of the first power amplifier to one of the at least two bus lines.

Example 38 is the method of any of examples 33 to 37, wherein a first filter is coupled between the envelope tracking circuit and the first bus line, and wherein a second filter is coupled between the envelope tracking circuit and the second bus line.

Example 39 is the method of any of examples 33 to 38, wherein the bus system comprises a third bus line, and wherein the method further comprises: simultaneously supplying one of a third supply voltage and a third bias signal to the third bus line; and if a third power amplifier of the plurality of power amplifiers receives a third radio frequency signal for amplification: selectively coupling the third power amplifier's input to the first bus line, if the one of the first supply voltage and the first bias signal is based on an envelope of a third baseband signal related to the third radio frequency signal; selectively coupling the third power amplifier's input to the second bus line, if the one of the second supply voltage and the second bias signal is based on the envelope of the third baseband signal; and selectively coupling the third power amplifier's input to the third bus line, if the one of the third supply voltage and the third bias signal is based on the envelope of the third baseband signal.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A transmitter, comprising:
    a bus system comprising a number of bus lines,
    [wherein the number of bus lines is equal to the maximum supported number of power amplifiers simultaneously operated in an active state,
    wherein the maximum supported number of power amplifiers simultaneously operated in an active state is at least two;]
    an envelope tracking circuit coupled to the number of bus lines,
    a filter coupled between the envelope tracking circuit and each of the number of bus lines; and
    a plurality of power amplifiers,
       wherein at least a first one of the plurality of power amplifiers, while in active state, is configured to selectively couple its input to one of the number of bus lines which is supplied with a supply voltage or a bias signal by the envelope tracking circuit that is based on an envelope of a first baseband signal related to a first radio frequency signal received by the first one of the plurality of power amplifiers; and
    wherein the number of bus lines is equal to a maximum supported number of the plurality of power amplifiers simultaneously operated in an active state, and
    wherein the maximum supported number of the plurality power amplifiers simultaneously operated in an active state is at least two.

2. The transmitter of claim 1, wherein the first one of the plurality of power amplifiers is configured to decouple its input from the number of bus lines if the first one of the plurality of power amplifiers is in an inactive state.

3. The transmitter of claim 2, wherein the first one of the plurality of power amplifiers comprises a switch circuit configured to:
    couple the input to the one of the number of bus lines, if the first one of the plurality of power amplifiers is in the active state, and
    couple a high impedance terminal of the first one of the plurality of power amplifiers to the one of the number of bus lines, if the first one of the plurality of power amplifiers is in the inactive state.

4. The transmitter of claim 3, wherein the switch circuit is configured to receive information about the one of the number of bus lines.

5. The transmitter of claim 1, wherein the envelope tracking circuit comprises:
    a direct current to direct current converter circuit configured to generate a plurality of predefined supply voltages;
    a first selection circuit configured to:
       select a first one of the plurality of predefined supply voltages based on the envelope of the first baseband signal, and
       supply the selected first one of the first plurality of predefined supply voltages to the one of the number of bus lines; and
    a second selection circuit configured to:
       select a second one of the plurality of predefined supply voltages based on an envelope of a second baseband signal related to a second radio frequency signal received by a second one of the plurality of power amplifiers for amplification, and
       predefined supply the selected second one of the plurality of supply voltages to another one of the number of bus lines.

6. The transmitter of claim 1, wherein the envelope tracking circuit comprises:
    a first digital-to-analog converter configured to:
       generate a first bias signal based on the envelope of the first baseband signal, and supply the generated first bias signal to the one of the number of bus lines; and
    a second digital-to-analog converter configured to:
       generate a second bias signal based on an envelope of a second baseband signal related to a second radio frequency signal received by a second one of the plurality of power amplifiers for amplification, and
       supply the generated second bias signal to another one of the number of bus lines.

7. The transmitter of claim 1, wherein at least two power amplifiers of the plurality of power amplifiers are simultaneously in the active state.

8. The transmitter of claim 1, wherein the maximum supported number of power amplifiers simultaneously operated in an active state is at least three.

9. The transmitter of claim 1, wherein the number of bus lines is smaller than the number of the plurality of power amplifiers.

10. A transmitter, comprising:
    a bus system comprising at least a first bus line and a second bus line;
    an envelope tracking circuit configured to simultaneously supply one of a first supply voltage and a first bias signal to the first bus line and one of a second supply voltage and a second bias signal to the second bus line; and
    a plurality of power amplifiers, wherein, if a first power amplifier of the plurality of power amplifiers receives a first radio frequency signal for amplification, the first power amplifier is configured to:
selectively couple its input to the first bus line, if the one of the first supply voltage and the first bias signal is based on an envelope of a first baseband signal related to the first radio frequency signal; and
selectively couple its input to the second bus line, if the one of the second supply voltage and the second bias signal is based on the envelope of the first baseband signal.

11. The transmitter of claim 10, wherein, if a second power amplifier of the plurality of power amplifiers receives a second radio frequency signal for amplification, the second power amplifier is configured to:
selectively couple its input to the first bus line, if the one of the first supply voltage and the first bias signal is based on an envelope of a second baseband signal related to the second radio frequency signal; and
selectively couple its input to the second bus line, if the one of the second supply voltage and the second bias signal is based on the envelope of the second baseband signal.

12. The transmitter of claim 11, wherein the envelope tracking circuit comprises:
a direct current to direct current converter circuit configured to generate a plurality of predefined supply voltages;
a first selection circuit configured to select, based on one of the envelope of the first baseband signal and the envelope of the second baseband signal, one of the plurality of supply voltages as the first supply voltage; and
a second selection circuit configured to select, based on the other one of the envelope of the first baseband signal and the envelope of the second baseband signal, one of the plurality of supply voltages as the second supply voltage.

13. The transmitter of claim 11, wherein the envelope tracking circuit comprises:
a first digital-to-analog converter configured to generate the first bias signal based on one of the envelope of the first baseband signal and the envelope of the second baseband signal; and
a second digital-to-analog converter configured to generate the second bias signal based on the other one of the envelope of the first baseband signal and the envelope of the second baseband signal.

14. The transmitter of claim 11, wherein the first power amplifier and the second power amplifier are configured to simultaneously receive the first radio frequency signal and the second radio frequency signal, respectively.

15. The transmitter of claim 10, wherein the first power amplifier is configured to decouple its input from the bus lines, if the first power amplifier does not receive the first radio frequency signal.

16. The transmitter of claim 10, wherein the first power amplifier is configured to couple its high impedance terminal to one of the first bus line and the second bus line, if the first power amplifier does not receive the first radio frequency signal.

17. The transmitter of claim 10, wherein a first filter is coupled between the envelope tracking circuit and the first bus line, and wherein a second filter is coupled between the envelope tracking circuit and the second bus line.

18. The transmitter of claim 10,
wherein the bus system comprises a third bus line,
wherein the envelope tracking circuit is configured to simultaneously supply one of a third supply voltage and a third bias signal to the third bus line, and
wherein, if a third power amplifier of the plurality of power amplifiers receives a third radio frequency signal for amplification, the third power amplifier is configured to:
selectively couple its input to the first bus line, if the one of the first supply voltage and the first bias signal is based on an envelope of a third baseband signal related to the third radio frequency signal;
selectively couple its input to the second bus line, if the one of the second supply voltage and the second bias signal is based on the envelope of the third baseband signal; and
selectively couple its input to the third bus line, if the one of the third supply voltage and the third bias signal is based on the envelope of the third baseband signal.

19. A method for operating a transmitter, wherein the transmitter comprises a bus system comprising at least two bus lines, an envelope tracking circuit coupled to the at least two bus lines, a filter coupled between the envelope tracking circuit and each of the at least two bus lines, and a plurality of power amplifiers, the method comprising:
for at least a first one of the plurality of power amplifiers, selectively coupling its input in an active state to one of the at least two bus lines which is supplied with a supply voltage or a bias signal by the envelope tracking circuit that is based on an envelope of a first baseband signal related to a first radio frequency signal received by the first one of the plurality of power amplifiers for amplification and
if the first one of the plurality of power amplifiers is in an inactive state, coupling a high impedance terminal of the first one of the plurality of power amplifiers to the one of the at least two bus lines.

20. The method of claim 19, further comprising:
if the first one of the plurality of power amplifiers is in an inactive state, decoupling its input from the at least two bus lines.

21. A method for operating a transmitter, wherein the transmitter comprises an envelope tracking circuit, a plurality of power amplifiers, and a bus system comprising at least a first bus line and a second bus line, the method comprising:
simultaneously supplying one of a first supply voltage and a first bias signal to the first bus line and one of a second supply voltage and a second bias signal to the second bus line using the envelope tracking circuit; and
if a first power amplifier of the plurality of power amplifiers receives a first radio frequency signal for amplification:
selectively coupling the first power amplifier's input to the first bus line, if the one of the first supply voltage and the first bias signal is based on an envelope of a first baseband signal related to the first radio frequency signal; and
selectively coupling the first power amplifier's input to the second bus line, if the one of the second supply voltage and the second bias signal is based on the envelope of the first baseband signal.

22. The method of claim 21, wherein, if a second power amplifier of the plurality of power amplifiers receives a second radio frequency signal for amplification, the method further comprises:

selectively coupling the second power amplifier's input to the first bus line, if the one of the first supply voltage and the first bias signal is based on an envelope of a second baseband signal related to the second radio frequency signal; and selectively coupling the second power amplifier's input to the second bus line, if the one of the second supply voltage and the second bias signal is based on the envelope of the second baseband signal.

\* \* \* \* \*